United States Patent [19]
Ker et al.

[11] Patent Number: 5,576,557
[45] Date of Patent: Nov. 19, 1996

[54] COMPLEMENTARY LVTSCR ESD PROTECTION CIRCUIT FOR SUB-MICRON CMOS INTEGRATED CIRCUITS

[75] Inventors: Ming-Dou Ker, Tainan Hsien; Chung-Yu Wu, Hsinchu; Hun-Hsien Chang, Taipei Hsien; Chung-Yuan Lee, Chungli; Joe Ko, Hsinchu, all of Taiwan

[73] Assignee: United Microelectronics Corp., Hsinchu, Taiwan

[21] Appl. No.: 422,225

[22] Filed: Apr. 14, 1995

[51] Int. Cl.[6] .................................................. H01L 29/74
[52] U.S. Cl. ........................ 257/173; 257/175; 257/141; 257/146; 257/361; 257/362; 361/90; 361/100; 361/111; 327/582
[58] Field of Search .................................... 257/173, 175, 257/141, 146, 157, 362, 361; 361/90, 100, 111; 327/582

[56] References Cited

U.S. PATENT DOCUMENTS

| | | | |
|---|---|---|---|
| 5,289,334 | 2/1994 | Ker et al. | 361/56 |
| 5,359,211 | 10/1994 | Croft | 257/173 |
| 5,400,202 | 3/1995 | Mtez et al. | 361/56 |

*Primary Examiner*—Jerome Jackson
*Assistant Examiner*—John Guay
*Attorney, Agent, or Firm*—Cushman Darby & Cushman, L.L.P.

[57] ABSTRACT

An electrostatic discharge (ESD) circuit for protecting a semiconductor integrated circuit (IC) device is disclosed. One ESD circuit is located between each I/O buffering pad that connects to one lead pin and the internal circuitry of IC. The ESD circuit is connected to both power terminals. The ESD circuit comprises first and second low-voltage-trigger SCRs (LVTSCRs), each having an anode, a cathode, an anode gate and a cathode gate. The anode and anode gate of the first SCR are connected to a first power terminal, the cathode of the first SCR is connected to its I/O buffering pad, and the cathode gate of the first SCR is connected to the second power terminal. The ESD circuit further comprises a PMOS transistor having drain, source, gate, and bulk terminals. The PMOS transistor's gate, source and bulk terminals are connected to the first power terminal, the PMOS transistor drain terminal is connected to the cathode gate of the first SCR. The cathode and cathode gate of the second SCR are connected to the second power terminals. The anode of the second SCR is connected to its associated I/O buffering pads. The anode gate of the second SCR is connected to the first power terminal. The ESD circuit also comprises an NMOS transistor having drain, source, gate, and bulk terminals. The NMOS transistor's gate, source and bulk terminals are connected to the second power terminals. The NMOS transistor's drain terminal is connected to the anode gate of the second SCR.

14 Claims, 5 Drawing Sheets

COMPLEMENTARY LVTSCR ESD PROTECTION CIRCUIT FOR SUB-MICRON CMOS INTEGRATED CIRCUITS

BACKGROUND OF THE INVENTION

1. Field of the Invention

The present invention relates in general to electrostatic discharge (ESD) protection circuits. In particular, the present invention relates to ESD protection circuits for sub-micron complementary metal-oxide semiconductor integrated circuits (CMOS IC's). More particularly, the present invention relates to ESD protection circuits for sub-micron CMOS IC's capable of triggering SCRs (SCR) thereof to activate the protection by lowering the trigger voltage thereof.

2. Description of Related Art

ESD, electrostatic discharge, is a common phenomenon found that occurs during handling of semiconductor IC devices. Electrostatic charges may accumulate for various reasons and cause damage to an IC device. Damage typically can occur during a testing phase of its fabrication, during assembly of the IC to a circuit board, as well as during the use of equipment into which the IC has been installed. Damage to a single IC due to poor ESD protection in an electronic equipment can hamper its designed functions partially, sometimes completely. Research in the ESD protection for semiconductor IC's is, therefore, an important issue.

Those skilled in the IC art know that the cause of ESD is explained by four different models. The first such model is the human-body model. It is set forth in U.S. Military Standard MIL-STD-883, Method 3015.6. This Military Standard models the electrostatic stress produced on an IC device when a human carrying electrostatic charges touches the lead pins of the IC device. The second is a machine model. This model is set forth in Industry Standard EIAJ-IC-121, which describes the electrostatic stress produced on an IC device when a machine carrying electrostatic charges contacts the lead pins of the IC device. The third model is the charged device model. This model describes the ESD current pulse generated when an IC device already carrying electro-static charges is grounded in the process of its handling. The fourth model is the field induced model, which describes the electric potential field induced in an IC device when it is placed in an electrostatic field. The electric potential field may produce ESD in the IC device when the device is later grounded during handling.

As the IC fabrication arts advance, there is more and more device miniaturization. Semiconductor devices having reduced-size now being fabricated employ photomasking procedures having patterns in resolutions in the range of less than 1-millionth of a meter, or, 1 micron. In this sub-micron size range, ESD protection circuits in semiconductor IC devices must be reduced in size as well. The design of the ESD circuits must be modified to accommodate the overall miniaturization. Lightly-doped drains (LDD), as well as the utilization of metal-silicide diffusion procedure in the fabrication, require the use of lateral SCRs (SCR) as the main components in the ESD circuits for facilitating the protection, while allowing the sub-micron semiconductor devices to function acceptably.

One constraining design factor of the lateral SCR's used in ESD protection circuits for sub-micron semiconductor devices is, however, inherent. Trigger voltage for lateral SCR's in sub-micron CMOS devices is in the range of 30 to 50 volts. The typical thickness of gate oxide layers in CMOS fabrication processes employing a resolution of 0.6–0.8 microns is about 150–200 angstrom. Considering a dielectric breakdown strength of 10 MV/cm for typical $SiO_2$ material, the gate oxide layers in these sub-micron CMOS devices would be destroyed by a voltage of 15–20 volts. Therefore, lateral SCR's with a trigger voltage in the range of 30–50 volts must be fitted with other protection components so that they can provide protection for gate oxide layers in the sub-micron CMOS IC devices.

Efforts have been made to lower the trigger voltage of the lateral SCR's in the ESD protection circuits for the sub-micron CMOS device. The trigger voltage is reduced to below the dielectric breakdown voltage of the gate oxide layers of the CMOS device, so that the ESD protection circuits can provide the protection for the CMOS device before being damaged themselves. Several ways to lower the trigger voltage of lateral SCR have been proposed.

For example, A. Chatterjee and T. Polgreen proposed a low-voltage trigger SCR (LVTSCR) configuration in "A low-voltage trigger SCR for on-chip ESD protection at outputs and input pads," Proc. 1990 Symposium on VLSI Technology, pp 75–86. In their disclosure, Chatterjee and Polgreen employed a short-channel NMOS transistor coupled to an SCR to form the low-voltage trigger SCR, hereafter referred to as LVTSCR, having a trigger voltage that is about equal to the breakdown voltage ($BV_{dss}$) of the short-channel NMOS transistor.

However, polarity characteristics arise in the stresses produced by these ESD discharges toward each of the two voltage planes VDD and VSS in the semiconductor power system caused by electrostatic charge build-up. There are four ESD stress patterns that can occur in an input or output buffering pad of the semiconductor IC device. They are, namely, the discharges of positive and negative currents at the input and output respectively. Each of these ESD patterns causes their respective pattern of damage to the NMOS and/or PMOS components of the input stage and output driver of the semiconductor device.

Conventional semiconductor IC devices employing these Low Voltage Trigger Silicon Controlled Rectifier (LVTSCR) components for ESD protection have their LVTSCR's arranged only in circuit locations between the input/output buffering pads and the VSS terminal of the entire IC device. No ESD protection was provided between the I/O buffering pads and the VDD terminal of an IC. Thus, when the VSS terminal of a CMOS semiconductor IC device is left floating, while an ESD stress arises between one of the I/O buffering pads and the device VDD terminal, the typical ESD current would flow in a path starting from the particular buffering pad, passing first through the LVTSCR, then to the VSS power terminal of the CMOS IC device, then penetrates through the ESD protection circuitry between the VDD and VSS terminals of the device, and finally discharges out of the IC device via the VDD lead pin.

As a result of the influences of parasitic resistance and capacitance that are inherent in the VSS and VDD lines of the CMOS IC device, the above-described ESD current flow path would induce unpredictable damages to the internal circuits of the IC device, as were indicated by C. Duvvury, R. N. Rountree and O. Adams in "Internal chip ESD phenomena beyond the protection circuit," IEEE Trans. on Electron Devices, Vol. 35, No. 12, pp 2133–2139, December 1988.

An effective and complete ESD protection device should, therefore, include direct protection measures between the I/O buffering pads of the IC device and both the VDD and VSS planes of the entire IC device.

SUMMARY OF THE INVENTION

It is therefore an object of the present invention to provide an ESD protection circuit for sub-micron CMOS IC devices capable of supplying direct static discharge paths at both the VDD and VSS ends of the IC device.

It is another object of the present invention to provide an ESD protection circuit for sub-micron CMOS IC devices capable of supplying direct static discharge paths at both the VDD and VSS ends of the IC device utilizing low-voltage trigger SCRs.

The present invention achieves the above-identified objects by providing a circuit arrangement for the ESD protection in a semiconductor IC device. One such ESD protection circuit is located between each of the I/O buffering pads that connects to one lead pin of the IC and the internal circuitry of the semiconductor IC device. The ESD protection circuit is connected to both of the pair of power terminals providing power to the IC. A conductor connects the I/O buffering pad and the internal function circuitry. The ESD protection circuit comprises a first SCR (SCR) having an anode, a cathode, an anode gate and a cathode gate. The anode and anode gate of the first SCR is connected to the first of the pair of power terminals, the cathode of the first SCR is connected to the I/O buffering pads, and the cathode gate of the first SCR is connected to the second of the pair of power terminals. The ESD protection circuit further comprises a PMOS transistor having drain, source, gate, and a bulk terminals. The gate, source and bulk terminals of the PMOS transistor are connected to the first of the pair of power terminals, the drain terminal of the PMOS transistor is connected to the cathode gate of the first SCR. The ESD protection circuit further comprises a second SCR having an anode, a cathode, an anode gate and a cathode gate. The cathode and cathode gate of the second SCR are connected to the second of the pair of power terminals, the anode of the second SCR is connected to the I/O buffering pads, and the anode gate of the second SCR is connected to the first of the pair of power terminals. The ESD protection circuit also comprises an NMOS transistor having drain, source, gate, and bulk terminals. The gate, source and bulk terminals of the NMOS transistor are connected to the second of the pair of power terminals, the drain terminal of the NMOS transistor is connected to the anode gate of the second SCR.

BRIEF DESCRIPTION OF THE DRAWING

Other objects, features and advantages of the present invention will become apparent by way of the following detailed description of the preferred but non-limiting embodiment. The description is made with reference to the accompanied drawings, wherein.

DETAILED DESCRIPTION OF THE PREFERRED EMBODIMENTS

Figure 1:
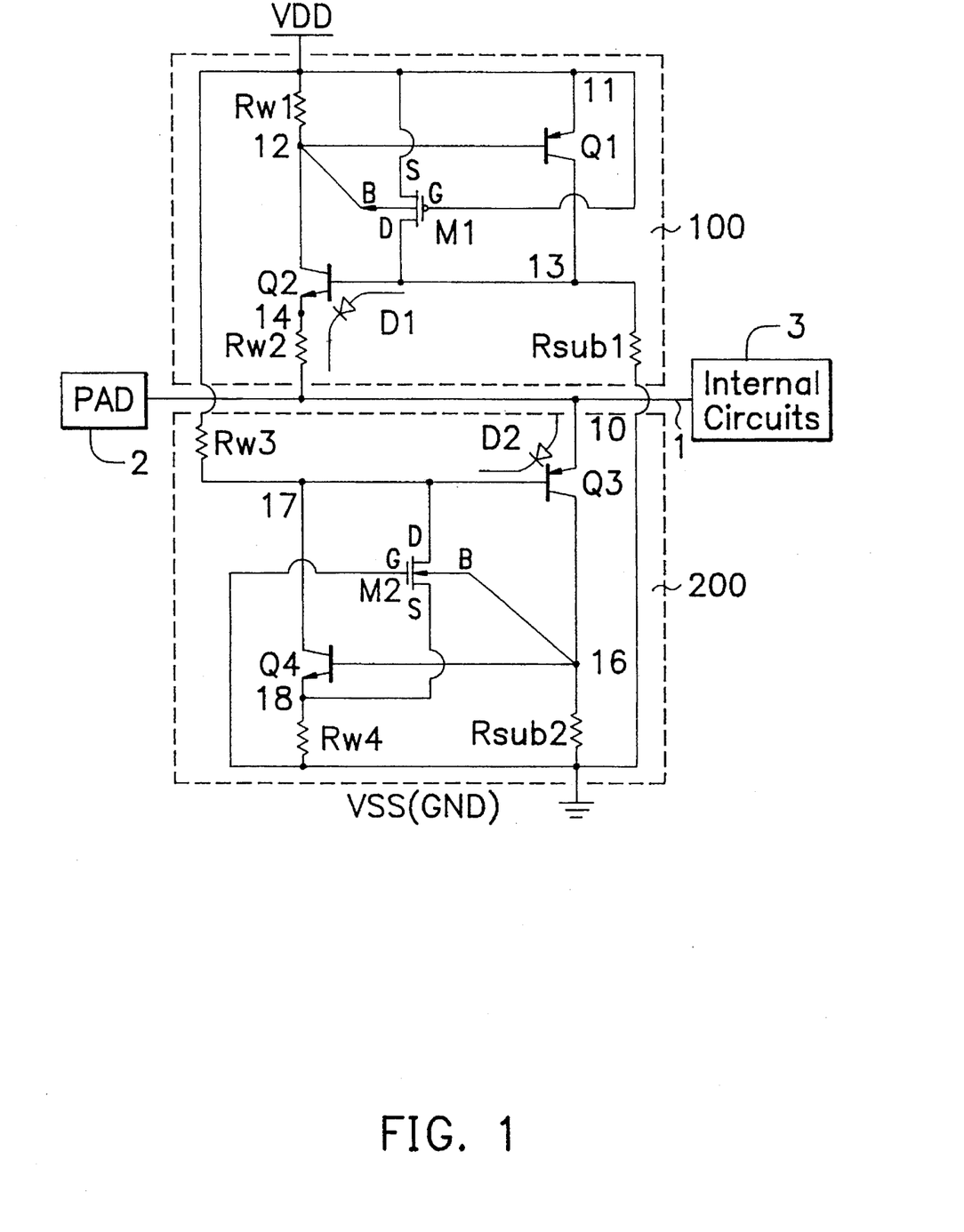
FIG. 1 is a schematic diagram of an ESD protection circuit in accordance with a preferred embodiment of the present invention.

FIG. 1 is a schematic diagram of an ESD protection circuit in accordance with a first preferred embodiment of the present invention. The ESD protection circuit is an Low Voltage Trigger Silicon Controlled Rectifier (LVTSCR)-based circuitry, which may be implemented on a semiconductor substrate of either the P- or N-type that carries the subject matter CMOS IC circuitry to be protected.

The ESD protection circuit comprises two LVTSCR's, namely the first LVTSCR 100 and the second LVTSCR 200 as outlined by the phantom lines. These LVTSCRs provide static discharge paths for the protected IC circuitry via the VDD and the VSS terminals of the semiconductor device.

The protected CMOS internal circuits 3 are safely located behind the two LVTSCR's 100 and 200. It is necessary to connect internal circuits 3 to I/O pad 2, connecting to a lead pin, via a conductor 1. Only one I/O buffering pad is shown in the drawing for the purpose of clarity, although there are more than one in any IC device of practical application. Thus, as is well known by those skilled in the IC art, the ESD protection circuits are normally connected between the internal circuits 3 to be protected and the I/O buffering pads that connect to the lead pins of the IC device so that paths can be set to conduct away undesirable currents caused by ESD.

The first LVTSCR 100, which serves to protect against the ESD that may arise between the VDD terminal and the IC lead pins, has its anode 11 connected directly to the VDD terminal of the entire CMOS IC device. Its cathode 14 is connected to the conductor 1 through a resistor Rw. On the other hand, the second LVTSCR 200, which serves to protect against the ESD that could arise between the VSS terminal and the IC device lead pins, has its anode 10 connected directly to the conductor 1. Its cathode 18 is connected to the VSS terminal of the entire CMOS IC through a resistor Rw4.

The first LVTSCR 100 that protects the ESD which is potential between the VDD terminal of the IC and the lead pin behind the buffering pad 2, comprises a pair of bipolar junction transistors Q1 and Q2. Q1 is a PNP while Q2 is an NPN transistor. The collector of the transistor Q1 is connected together with the base of the transistor Q2, forming a cathode gate identified by the node 13, which is tied to the VSS terminal of the CMOS IC device via a resistor Rsub1. The base of Q1 is connected to the collector of Q2 to form the anode gate identified by the node 12 that is tied to the VDD terminal of the CMOS IC via a resistor Rw1.

The first LVTSCR 100 further comprises a PMOS transistor M1 having drain D, gate G, source S and bulk B terminals. Drain D of M1 is connected to node 13 (and the base of Q2). Bulk terminal B of M1 is connected to junction of Rw1 and the collector of Q2. Source S of M1 is connected to VDD. Gate G of M1 is connected to the emitter of Q1.

The emitter-base junction of the NPN transistor Q2 constitutes an equivalent junction diode identified by D1 in the drawing. The equivalent junction diode D1 has its anode and cathode pair connected between the cathode gate 13 of the first LVTSCR 100 and its associated I/O buffering pad 2.

Refer now to the portion of the second LVTSCR 200 shown in FIG. 1. The second LVTSCR 200 that protects against the potential ESD between the VSS terminal of the IC and the lead pin behind the buffering pad 2, comprises a pair of bipolar junction transistors Q3 and Q4. Q3 is a PNP while Q4 is an NPN transistor. The collector of the transistor Q3 is connected together with the base of the transistor Q4, forming a cathode gate identified by the node 16, which is tied to the VSS terminal of the CMOS IC device via a resistor Rsub1. The base of Q3 is connected to the collector of Q4 to form an anode gate identified by the node 17 that is tied to the VDD terminal of the CMOS IC via a resistor Rw3.

The second LVTSCR 200 further comprises an NMOS transistor M2, having drain D, gate G, source S, and bulk B terminals. Bulk terminal B of M2 is connected to the junction of Rsub1 and the base of Q4. Source S of M2 is connected to the junction of Rw and the emitter of Q4. Gate G of M2 is connected to Vss. Drain D of M2 is connected to the junction of the base of Q3 and Rw3, node 17.

Because M1 is a PMOS transistor and M2 is an NMOS transistor, drain D of M1 (PMOS) is connected to a lower potential than the source terminal of itself, while the source terminal of M2 (NMOS) is connected to a lower potential than the drain terminal thereof.

The emitter-base junction of the PNP transistor Q3 constitutes an equivalent junction diode identified by D2 in the drawing. The equivalent junction diode D2 has its anode and cathode pair connected between the very I/O buffering pad 2 and the anode gate 17 of the second LVTSCR 200.

Resistors Rw1, Rw and Rsub1 found in the first LVTSCR 100, as well as the resistors Rw3, Rw and Rsub1 in the second LVTSCR 200 in the schematic diagram, as drawn, are essentially equivalent resistors as a result of the inherent parasitic resistance in the circuitry itself.

There are four different ESD modes that can occur at an I/O buffering pad 2, which connects to one lead pin of the semiconductor IC device. They include the following:

(a) PS mode. The VDD terminal of the entire device is kept floating, while a positive ESD stress is present against the VSS terminal of the device.

(b) NS mode. The VDD terminal of the entire device is kept floating, while a negative ESD stress is present against the VSS terminal of the device.

(c) PD mode. The VSS terminal of the entire device is kept floating, while a positive ESD stress is present against the VDD terminal of the device.

(d) ND mode. The VSS terminal of the entire device is kept floating, while a negative ESD stress is present against the VDD terminal of the device.

The ESD protection circuit in accordance with the preferred embodiment, above described, of the present invention for each of the above-identified ESD modes will be described below.

During PS mode of ESD, the VDD terminal of the entire device is kept floating, while a positive ESD stress is present against the VSS terminal of the device due to electrostatic charge occurrence between the I/O buffering pad 2 and the VSS terminal. The ESD voltage approaches the emitter-base junction of the transistor Q3 via the anode 10 (which is the collector node of Q3) of the second LVTSCR 200. The forward-biasing of the emitter-base junction of Q3 causes the ESD voltage to propagate to the drain D of the NMOS transistor M2, which is also the node of the anode gate 17 of the second LVTSCR 200.

Due to the effect of snapback breakdown on the drain D of the NMOS transistor M2, the presence of the ESD voltage on the drain D of M2 causes the positive ESD voltage on the I/O buffering pad 2 to be first clamped to the snapback breakdown voltage of the NMOS transistor M2, which is in the range of about 11 to 13 volts. When the snapback breakdown takes place on the drain D of the NMOS transistor M2, the electric current caused by this mode of ESD flows from the emitter to the base of transistor Q3, then to the base (i.e., the cathode gate 16 of the second LVTSCR 200) of transistor Q4 via the drain D and the bulk B of the NMOS transistor M2, and finally to the emitter of transistor Q4 that connects to the VSS terminal of the IC device via the parasitic resistor Rw. This facilitates the discharge current flow path in this PS mode of ESD and will trigger on the LVTSCR 200.

The snapback breakdown effect that takes place at the NMOS transistor M2 triggers the latch-up of the second LVTSCR 200. Once the second LVTSCR 200 is latched up, the discharge current caused by the ESD then discharges through the lateral SCR component comprised basically of the bipolar junction transistor pair Q3 and Q4. The voltage that appears on the I/O buffering pad 2 will then be clamped to the level of 1 to 2 volts due to the conduction of the lateral SCR component. The IC circuit 3 behind the LVTSCR 200 is thus protected from exposure to excessive ESD current caused by electrostatic charge.

The purpose for the inclusion of the NMOS transistor M2 in the structural configuration of lateral SCR is primarily to take advantage of the lowering of the trigger voltage for the lateral SCR to a practical range for sub-micron IC devices. The snapback breakdown effect that takes place in NMOS transistor M2 triggers the conductance of the lateral SCR, and brings the trigger voltage to the range of the snapback breakdown voltage of the NMOS transistor M2, which is about 11 to 13 volts. This voltage is greatly lower than the inherent trigger voltage of 30 to 50 volts for a normal SCR component.

This also allows the second LVTSCR 200 to function in the PS mode of ESD for the protection of the CMOS IC circuitry located behind, without the need to utilize any additional ESD protection element. Due to the SCR's characteristic of high power capacity, the second LVTSCR 200 thus is also capable of providing protection against high ESD current for the IC circuitry within a relatively smaller semiconductor layout area. Furthermore, the trigger voltage is also significantly lower making it suitable for use in sub-micron IC devices.

During NS mode of ESD, the VDD terminal of the entire device is kept floating, while a negative ESD stress is present against the VSS terminal of the device due to electrostatic charge occurrence between the I/O buffering pad 2 and the VSS terminal. Since the ESD voltage existing between the conductor 1 and the VSS terminal is negative, it forward biases the equivalent diode D1 in the first LVTSCR 100. This allows the NS mode of ESD current to directly discharge via the diode D1.

During PD mode of ESD, the VSS terminal of the entire device is kept floating, while a positive ESD stress is present against the VDD terminal of the device due to electrostatic charge occurrence between the I/O buffering pad 2 and the VDD terminal. Due to the fact that the ESD voltage in existence between the conductor 1 and the VDD terminal is positive, which happens to forward bias the equivalent diode D2 in the second LVTSCR 200. This allows the PD mode of ESD current to directly discharge via the diode D2.

During ND mode of ESD, the VSS terminal of the entire device is kept floating, while a negative ESD stress is present against the VDD terminal of the device due to electrostatic charge occurrence between the I/O buffering pad 2 and the VDD terminal. The ESD voltage approaches the emitter-base junction of the transistor Q2 via the cathode 14 (which is the emitter node of Q2) of the first LVTSCR 100. The forward-biasing of the emitter-base junction of Q2 causes the ESD voltage to propagate to the drain D of the PMOS transistor M1, which is also the node of the cathode gate 13 of the first LVTSCR 100.

Due to the effect of snapback breakdown on the drain D of the PMOS transistor M1, the presence of the ESD voltage on the drain D of M1 causes the negative ESD voltage on the I/O buffering pad 2 to be first clamped to the snapback breakdown voltage of the PMOS transistor M1, which is in the range of about −11 to −13 volts. When snapback breakdown takes place on the drain D of the PMOS transistor M1, the electric current caused by this mode of ESD flows from the emitter to the base of transistor Q1, then to the base (i.e., the anode gate 12 of the first LVTSCR 100) of transistor Q2 via the drain D and the bulk B of the PMOS transistor M1, and finally to the emitter of transistor Q2 that connects to the conductor 1 that leads to the I/O buffering pad 2 via the parasitic resistor Rw. This facilitates the discharge current flow path in this ND mode of ESD and will trigger on the LVTSRC 100.

The snapback breakdown effect that takes place at the PMOS transistor M1 triggers the latch-up of the first LVTSCR 100. Once the first LVTSCR 100 is latched up, the discharge current caused by the ESD then discharges through the lateral SCR component comprising primarily the bipolar junction transistor pair Q1 and Q2. The voltage that appears on the I/O buffering pad 2 will then be clamped to the level of −1 to −2 volts due to the conduction of the lateral SCR component. The IC circuit 3 behind the LVTSCR 100 is thus protected from exposure to excessive ESD current caused by electrostatic charge.

The purpose for the inclusion of the PMOS transistor M1 in the structural configuration of a lateral SCR is primarily to take advantage of the lowering of the trigger voltage for the lateral SCR to a practical range for sub-micron IC devices. The snapback breakdown effect that takes place in PMOS transistor M1 triggers the conductance of the lateral SCR, and brings the trigger voltage within the range of the snapback breakdown voltage of the PMOS transistor M1, which is about −11 to −13 volts. This voltage is greatly higher than the inherent trigger voltage of −30 to −50 volts for a normal SCR component.

This also allows the first LVTSCR 100 to function in the ND mode of ESD to protect of the CMOS IC circuitry located behind, without the need to utilize any additional ESD protection element. Due to the SCR's characteristic of high power capacity, the first LVTSCR 100 thus is also capable of providing protection against high ESD current for the IC circuitry within a relatively smaller semiconductor layout area. Further, the trigger voltage is also significantly lower making it suitable for use in sub-micron IC devices.

Figure 2:
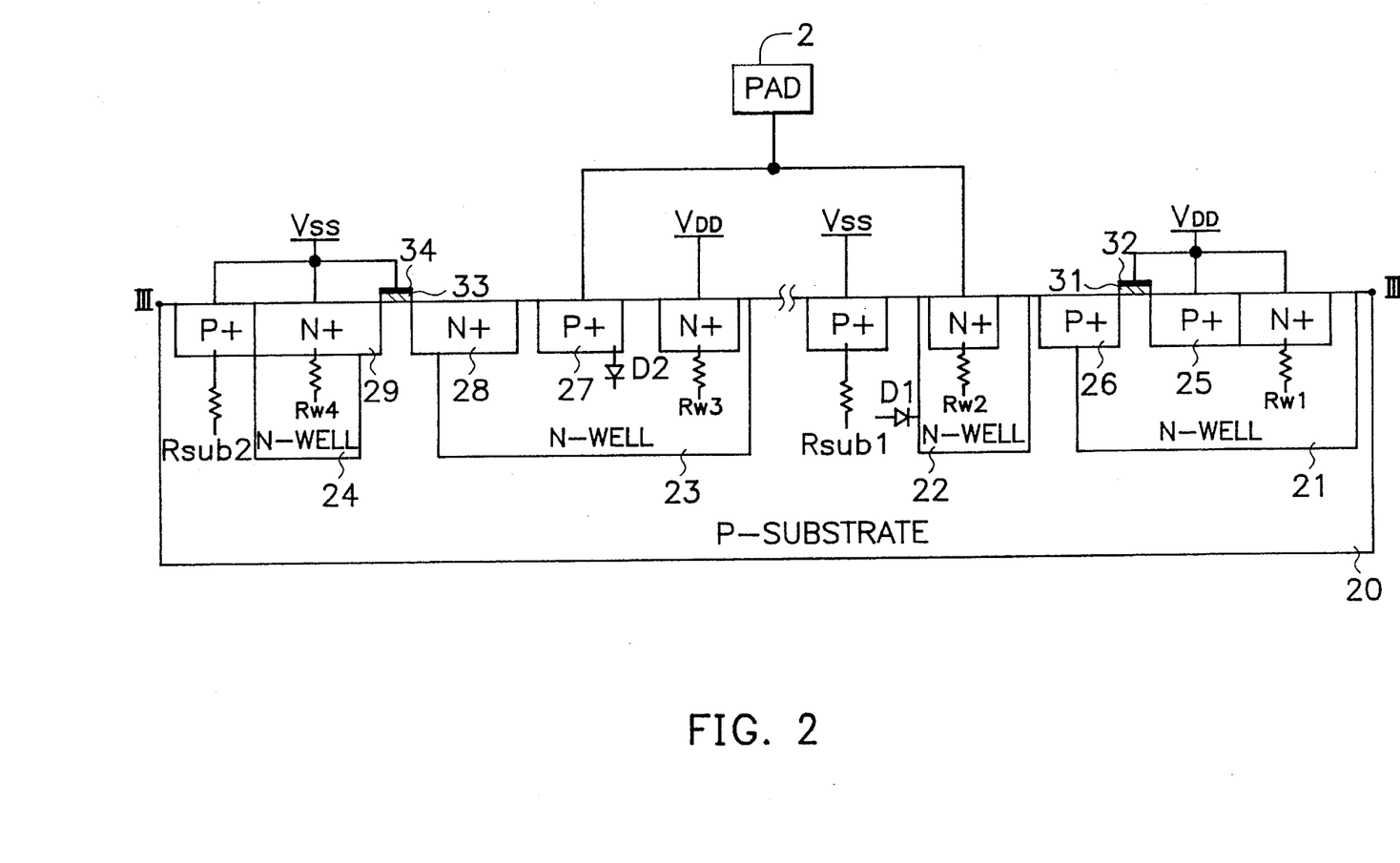
FIG. 2 shows schematically a cross section of the semiconductor structural configuration of the ESD protection circuit in accordance with the preferred embodiment of the present invention as implemented on a P-type substrate for the protected integrated circuit device.

FIG. 2 schematically shows in cross section the semiconductor structural configuration of the ESD protection circuit corresponding to the above-described embodiment of the present invention, as implemented on a P-type substrate for the protected integrated circuit device.

Substrate 20, which is a P-type substrate, constitutes the back plane for fabrication of the CMOS integrated circuit device, together with the ESD protection circuits constructed therewith. On the P-type substrate 20 there are two neighboring N-type well regions, namely the first and second N-type well regions 21 and 22, located to the right of the substrate 20. There is another pair of N-type well regions 23 and 24 are located to the left.

A first heavily-doped P-type region 25 is formed inside the first N-type well region 21, while a second heavily-doped P-type region 26 straddles the boundary of the first N-type well region 21 and the surrounding substrate 20. Similarly, there is a third heavily-doped P-type region 27 formed inside the third N-type well region 23, and a first heavily-doped N-type region 28 straddling the boundary of the third N-type well region 23 and the surrounding substrate 20. A second heavily-doped N-type region 29 is formed in the surface portion of the fourth N-type well region 24, with a surface area larger than that of the well itself and extending into the substrate 20.

Based on this P-type substrate 20, the ESD protection circuit as outlined in the schematic diagram of FIG. 1 can be implemented thereon to facilitate ESD protection for the CMOS IC circuitry fabricated on the substrate 20. The presence of the ESD protection circuits, namely the first and second LVTSCR's 100 and 200 on this substrate is described below.

As to the first LVTSCR 100, the pair of bipolar junction transistors Q1 and Q2, together with the PMOS transistor M1, are fabricated on substrate 20 at the right-hand portion. Transistor Q1 is an attached PNP bipolar junction transistor having its emitter, base and collector terminals formed by the first heavily-doped P-type region 25, the first N-type well region 21, and the P-type substrate 20 respectively. Its base terminal, namely the first N-type well region 21, is connected to the VDD terminal of the device via an inherent and parasitic resistor Rw1. Its collector, which is the substrate 20, is connected to the VSS terminal via another inherent parasitic resistor Rsub1.

Transistor Q2, on the other hand, is another attached NPN bipolar junction transistor having its emitter, base and collector terminals formed by the second N-type well region 22, the P-type substrate 20, and the first N-type well region 21 respectively. Its emitter terminal, that is, the second N-type well region 22, is connected to the I/O buffering pad 2 via a parasitic resistor Rw2.

Then, the transistor M1 is a PMOS transistor having its drain, source and bulk terminals formed by the second heavily-doped P-type region 26, the first heavily-doped P-type region 25 (which is also the VDD-connected emitter for the transistor Q1), and the first N-type well region 21 (which is the base of the Q1) respectively. The gate of the transistor M1 is made by forming a thin oxide layer 31 on the area of the first N-type well region between the first and second heavily-doped P-type regions 25 and 26 and then forming a gate poly layer 32. This gate of transistor M1 is tied to the VDD terminal of the IC device to ensure that the PMOS transistor M1 maintains its off state during the normal operation period of the CMOS IC device constructed on the P-type substrate 20. The two bipolar junction transistors Q1 and Q2 together constitute the lateral SCR device for the LVTSCR 100.

As to the second LVTSCR 200, the pair of bipolar junction transistors Q3 and Q4, together with the NMOS transistor M2, are fabricated on substrate 20 at the left-hand portion. Transistor Q3 is an attached PNP bipolar junction transistor having its emitter, base and collector terminals formed by the third heavily-doped P-type region 27, the third N-type well region 23, and the P-type substrate 20 respectively. Its base terminal, namely the third N-type well region 23, is connected to the VDD terminal of the device via an inherent and parasitic resistor Rw3. Its collector, which is the substrate 20, is connected to the VSS terminal via another inherent parasitic resistor Rsub2.

Transistor Q4, on the other hand, is another attached NPN bipolar junction transistor having its emitter, base and collector terminals formed by the fourth N-type well region 24, the P-type substrate 20, and the third N-type well region 23 respectively. Its emitter terminal, that is, the fourth N-type well region 24, is connected to the VSS terminal of the device via a parasitic resistor Rw4.

The transistor M2 is an NMOS transistor having its drain, source and bulk terminals formed by the first heavily-doped N-type region 28 (that is, the base of Q3), the second heavily-doped N-type region 29 (which is also the emitter of the transistor Q4), and the P-type substrate 20 (base of Q4) respectively. The gate of the transistor M2 is made by forming a thin oxide layer 33 on the area of the P-type substrate 20 between the first and second heavily-doped N-type regions 28 and 29 and then forming a gate poly layer 34. This gate of transistor M2 is tied to the VSS terminal of the IC device to ensure that the NMOS transistor M2 maintains in its off state during the normal operation period of the CMOS IC device constructed on the P-type substrate 20. The two bipolar junction transistors Q3 and Q4 together constitutes another lateral SCR device for the LVTSCR 200.

The equivalent diodes D1 and D2 of the first and second LVTSCR's 100 and 200 are formed inherently within the NPN and PNP bipolar junction transistors Q2 and Q3 respectively, thus, their presence on the semiconductor substrate is also apparent.

Figure 3:
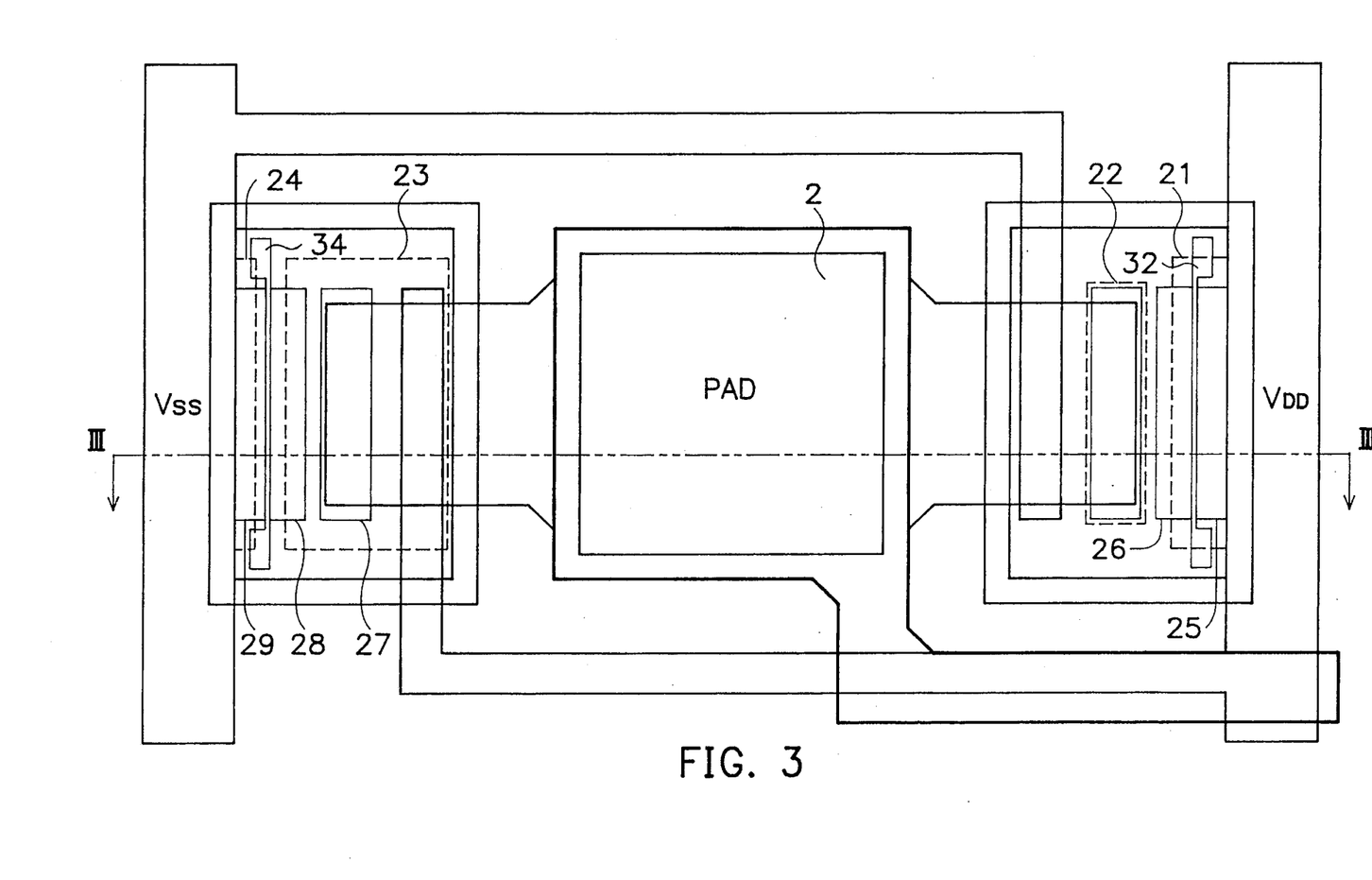
FIG. 3 schematically shows a top view of the semiconductor structure corresponding to the configuration of the ESD protection circuit shown in FIG. 2.

FIG. 3 of the drawing schematically shows the corresponding top view of the semiconductor structural configuration of the ESD protection circuit of FIG. 2. Along the III-III' line in the drawing is the plane along which the cross-sectional view of FIG. 2 was taken. An examination of the top view of FIG. 3 reveals the fact that the ESD protection circuit of the present invention can be fabricated in a relatively very small layout area on a semiconductor substrate, while providing effectively the protection against the ESD inherent in the sub-micron semiconductor IC device incorporated therewith.

Figure 4:
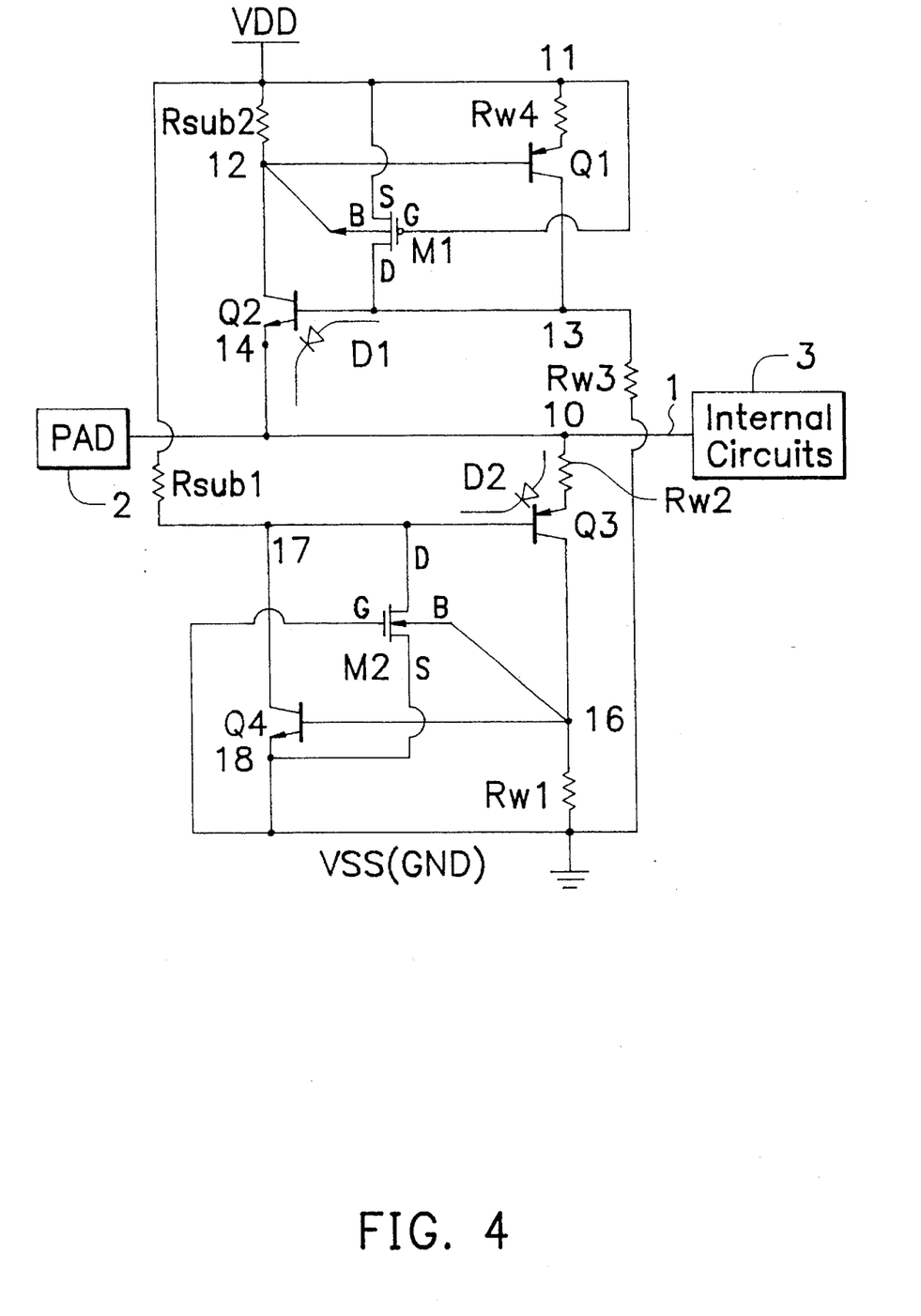
FIG. 4 is a schematic diagram of an ESD protection circuit in accordance with another preferred embodiment of the present invention.

FIG. 4 of the drawing shows the schematic diagram of an ESD protection circuit in accordance with another embodiment of the present invention. In this embodiment, the ESD protection circuit and its protected subject matter, the CMOS IC circuitry, are implemented on an N-type substrate. As persons skilled in the art can appreciate, this second embodiment of the present invention of FIG. 4 is similar to that shown in FIG. 1, with the basic difference being that the type of substrate employed for the fabrication is N-type.

Figure 5:
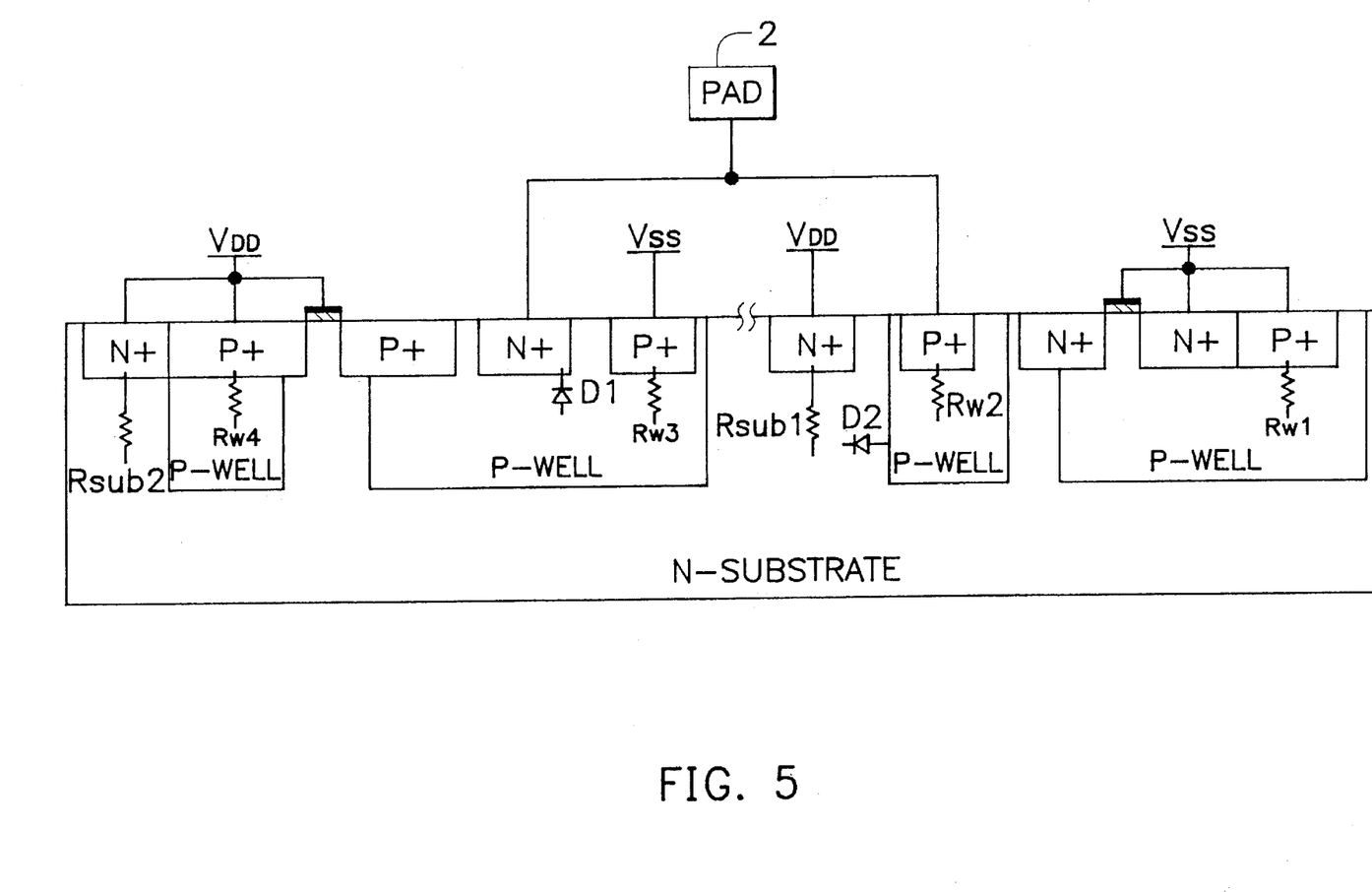
FIG. 5 schematically shows in cross section of a semiconductor structural configuration of the ESD protection circuit in accordance with the preferred embodiment of the present invention shown in FIG. 4 as implemented on an N-type substrate for the protected integrated circuit device.

FIG. 5 of the drawing schematically shows in cross section the semiconductor structural configuration of the ESD protection circuit in accordance with the embodiment of the present invention as outlined in the schematic diagram of FIG. 4.

Based on the above description of the details of the present invention presented in a couple of preferred embodiments, it is apparent to persons skilled in the art that the ESD protection circuit for sub-micron IC devices possesses the following advantages over the prior art equivalent:

The present inventive ESD protection circuit for sub-micron semiconductor IC provides for effective ESD protection over a relatively much smaller surface layout area in the semiconductor substrate. This is because the trigger voltage of the LVTSCR's of the present invention is effectively lowered. No additional protection element is necessary as in the case of the conventional ESD protection circuit, which contributes to the reduction of the die surface area.

Also, ESD stresses occurred between an I/O buffering pad and both the VDD and VSS terminals of the IC device can be effectively and directly discharged.

In addition, the ESD protection circuit of the present invention is suitable for implementation on both CMOS and BiCMOS semiconductor integrated circuit devices. The ESD protection circuit is compatible with both the N-type well/P-type substrate and the P-type well/N-type substrate, as well as twin-well fabrications, which adds to the flexibility of the use of the ESD protection circuit in various semiconductor IC applications.

We claim:

1. A circuit arrangement for electrostatic discharge protection of a semiconductor integrated circuit (IC) device, one said circuit being located between each I/O buffering pad that connects to one lead pin with internal circuitry of said IC, said circuit arrangement being connected to both of a pair of power terminals and a conductor connecting said I/O buffering pad and said internal circuitry, said circuit arrangement comprising:

a first SCR having an anode, a cathode, an anode gate and a cathode gate, said anode and anode gate of said first SCR being connected to the first of said pair of power terminals, said cathode of said first SCR being connected to its associated buffering pad, and said cathode gate of said first SCR being connected to the second of said pair of power terminals;

a PMOS transistor having drain, source, gate, and bulk terminals, said gate, source and bulk terminals of said PMOS transistor being connected to the first of said pair of power terminals, said drain terminal of said PMOS transistor being connected to said cathode gate of said first SCR;

a second SCR having an anode, a cathode, an anode gate and a cathode gate, said cathode and cathode gate of said second SCR being connected to the second of said pair of power terminals, said anode of said second SCR being connected to its associated I/O buffering pad, and said anode gate of said second SCR being connected to the first of said pair of power terminals; and an NMOS transistor having drain, source, gate, and bulk terminals, said gate, source and bulk terminals of said NMOS transistor being connected to the second of said pair of power terminals, said drain terminal of said NMOS transistor being connected to said anode gate of said second SCR.

2. A circuit arrangement according to claim 1, wherein said first SCR comprises a first PNP bipolar junction transistor and a first NPN bipolar junction transistor, each of said first PNP and NPN bipolar junction transistors having a collector, a base and an emitter terminal, the base of said first PNP transistor and the collector of said first NPN transistor being connected together to form said anode gate of said first SCR, the collector of said first PNP transistor and the base of said first NPN transistor being connected together to form said cathode gate of said first SCR, the emitter of said first PNP transistor forming said anode of said first SCR, and the emitter of said first NPN transistor forming said cathode of said first SCR.

3. A circuit arrangement according to claim 2, wherein a base-emitter junction of said first NPN bipolar junction transistor forms a first equivalent diode.

4. A circuit arrangement according to claim 1, wherein said second SCR comprises a second PNP bipolar junction transistor and a second NPN bipolar junction transistor, each of said second PNP and NPN bipolar junction transistors having a collector, a base and an emitter terminal, the base of said second PNP transistor and the collector of said second NPN transistor being connected together to form said anode gate of said second SCR, the collector of said second PNP transistor and the base of said second NPN transistor being connected together to form said cathode gate of said first SCR, the emitter of said second PNP transistor forming said anode of said second SCR, and the emitter of said second NPN transistor forming said cathode of said second SCR.

5. A circuit arrangement according to claim 4 wherein a emitter-base junction of said second PNP bipolar junction transistor forms a second equivalent diode.

6. A circuit arrangement according to claim 1, wherein said circuit arrangement is fabricated on a semiconductor substrate of a first conductivity type, said semiconductor substrate comprising:

a pair of neighboring first and second well regions and another pair of neighboring third and fourth well regions formed on said substrate, wherein said four well regions are doped with impurities of a second conductivity type;

a first heavily-doped region of the first conductivity type formed in said first well region, a second heavily-doped region of the first conductivity type formed in the boundary of said first well region and said substrate, and a third heavily-doped region of the first conductivity type formed in said third well region;

a first heavily-doped region of the second conductivity type formed in the side of said third well region and extending toward said fourth well region and into said substrate, and a second heavily-doped region of the second conductivity type formed in said fourth well region and extending toward said third well region and into said substrate;

a first thin oxide layer formed on said first well region between said first heavily-doped region of the first conductivity type and the second heavily-doped region of the first conductivity type, and a first gate oxide layer formed on said first thin oxide layer; and a second thin oxide layer formed on said substrate between said first heavily-doped region of the second conductivity type and the second heavily-doped region of the second conductivity type, and a second gate polycrystalline layer formed on said second thin oxide layer.

7. A circuit arrangement according to claim 6, wherein said first heavily-doped region of the first conductivity type, said first well region of the second conductivity type, and said substrate of the first conductivity type form the emitter, base and collector of a bipolar junction transistor, respectively.

8. A circuit arrangement according to claim 6, wherein said second well region of the second conductivity type, said substrate and said first well region of the second conductivity type form the emitter, base and collector of a bipolar junction transistor, respectively.

9. A circuit arrangement according to claim 6, wherein said first heavily-doped region of the first conductivity type, said second heavily-doped region of the first conductivity type, said first gate oxide layer and said first well region of the second conductivity type form the source, drain, gate and bulk terminals of a MOS transistor respectively.

10. A circuit arrangement according to claim 6, wherein said third heavily-doped region of the first conductivity type, said third well region of the second conductivity type and said substrate of the first conductivity type form the emitter, base and collector of a bipolar junction transistor respectively.

11. A circuit arrangement according to claim 6, wherein said fourth well region of the second conductivity type, said substrate and said third well region of the second conductivity type forming the emitter, base and collector of a bipolar junction transistor respectively.

12. A circuit arrangement according to claim 6, wherein said first heavily-doped region of the second conductivity type, said second heavily-doped region of the second conductivity type, said second gate oxide layer and said substrate form the drain, source, gate and bulk terminals of a MOS transistor respectively.

13. A circuit arrangement according to claim 6, wherein said first conductivity type is P-type and said second conductivity type is N-type.

14. A circuit arrangement according to claim 6, wherein said first conductivity type is N-type and said second conductivity type is P-type.

* * * * *